(12) United States Patent
Matsuo et al.

(10) Patent No.: US 6,721,390 B2
(45) Date of Patent: Apr. 13, 2004

(54) SOFT X-RAY REDUCTION PROJECTION EXPOSURE SYSTEM, SOFT X-RAY REDUCTION PROJECTION EXPOSURE METHOD AND PATTERN FORMATION METHOD

(75) Inventors: Takahiro Matsuo, Uji (JP); Masaru Sasago, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/164,615

(22) Filed: Jun. 10, 2002

(65) Prior Publication Data

US 2003/0016780 A1 Jan. 23, 2003

(30) Foreign Application Priority Data

Jul. 18, 2001 (JP) ........................................ 2001-218473

(51) Int. Cl.⁷ ................................................ G21K 5/00
(52) U.S. Cl. ........................................................ 378/34
(58) Field of Search ................................................ 378/34

(56) References Cited

U.S. PATENT DOCUMENTS 5,353,323 A * 10/1994 Hirokawa et al. ............ 378/34

FOREIGN PATENT DOCUMENTS

| JP | 64-010625 A | 1/1989 |
|----|-------------|--------|
| JP | 06-151281 A | 5/1994 |

* cited by examiner

Primary Examiner—Craig E. Church
(74) Attorney, Agent, or Firm—McDermott, Will & Emery

(57) ABSTRACT

A soft X-ray reduction projection exposure system includes a light source for generating a soft X-ray beam of a wavelength of a 4 through 20 nm band; a reflecting mask on which a desired pattern is formed; an illumination optical system for irradiating the reflecting mask with the soft X-ray beam; a reduction projection optical system for imaging the pattern of the reflecting mask on a wafer; and a controlling section for controlling a partial pressure of a gas of a carbon compound to be $1.33 \times 10^{-8}$ Pa or less in at least one of a first region where the illumination optical system is disposed, a second region where the reflecting mask is disposed and a third region where the reduction projection optical system is disposed.

36 Claims, 7 Drawing Sheets

SOFT X-RAY REDUCTION PROJECTION EXPOSURE SYSTEM, SOFT X-RAY REDUCTION PROJECTION EXPOSURE METHOD AND PATTERN FORMATION METHOD

BACKGROUND OF THE INVENTION

The present invention relates to a soft X-ray reduction projection exposure system, a soft X-ray reduction projection exposure method and a pattern formation method all using a soft X-ray beam as exposing light.

As the degree of integration of semiconductor integrated circuits is increased to further reduce the line width of circuits, lithography technique for forming a finer pattern is necessary.

Photolithography using KrF excimer laser (of a wavelength of 248 nm) is currently principally under development, and it is necessary to shorten the wavelength of exposing light in order to further increase the resolution.

It has been proved that a fine pattern with a width of 100 nm or less can be formed by photolithography using ArF excimer laser (of a wavelength of 193 nm) or $F_2$ laser (of a wavelength of 157 nm) having a wavelength shorter than that of the KrF excimer laser.

Also, EUV lithography using a soft X-ray beam (of a wavelength of 13.4 nm) capable of realizing resolution of 30 nm has recently been developed.

An exposure system for the EUV lithography includes, as disclosed in Japanese Laid-Open Patent Publication No. 01-010625, a light source for generating a soft X-ray beam, a reflecting mask and a reduction projection optical system for transferring a pattern of the reflecting mask onto a wafer. The reduction projection optical system includes a combination of several non-spherical reflecting mirrors. Furthermore, since light does not transmit the air in the wavelength region of a soft X-ray beam (principally a 4 nm through 20 nm wavelength band), the inside of the exposure system should be evacuated.

A conventional exposure system for the EUV lithography has a problem of contamination of the reflecting mirrors and the reflecting mask with organic substances. The contamination is caused principally by a decomposed substance from a resist film and an organic substance adhered onto the inside wall of the exposure system. In particular, an organic substance floating within the exposure system is decomposed by the soft X-ray beam during the exposure and the thus decomposed substance is adhered onto the surface of the reflecting mirror, so that a carbon film may be deposited on the reflecting mirror.

When a carbon film is deposited on the reflecting mirror, the reflectance of the reflecting mirror is lowered. Therefore, the optical characteristic of the reduction projection optical system is harmfully affected and specifically, for example, aberration is caused. For example, if a carbon film with a thickness of 1 nm is deposited on a reflecting mirror made from a multi-layer film composed of a molybdenum film and a silicon film, the reflectance is lowered from 65% to 64%.

Furthermore, if the carbon film deposited on the reflecting mirror has an uneven thickness, large aberration is caused.

SUMMARY OF THE INVENTION

In consideration of the aforementioned conventional problems, an object of the invention is, in a soft X-ray reduction projection exposure system, a soft X-ray reduction projection exposure method and a pattern formation method using a soft X-ray beam as exposing light, preventing a carbon film from depositing on the surface of a reflecting mask, an illumination optical system for irradiating the reflecting mask with the soft X-ray beam or a reduction projection optical system for imaging a pattern of the reflecting mask.

In order to achieve the object, the first soft X-ray reduction projection exposure system of this invention comprises a light source for generating a soft X-ray beam of a wavelength of a 4 through 20 nm band; a reflecting mask on which a desired pattern is formed; an illumination optical system for irradiating the reflecting mask with the soft X-ray beam; a reduction projection optical system for imaging the pattern of the reflecting mask on a wafer; and controlling means for controlling a partial pressure of a gas of a carbon compound to be $1.33 \times 10^{-8}$ Pa or less in at least one of a first region where the illumination optical system is disposed, a second region where the reflecting mask is disposed and a third region where the reduction projection optical system is disposed.

In the first soft X-ray reduction projection exposure system, the controlling means controls the partial pressure of the gas of the carbon compound to be $1.33 \times 10^{-8}$ Pa or less in at least one of the first region where the illumination optical system is disposed, the second region where the reflecting mask is disposed and the third region where the reduction projection optical system is disposed. Therefore, a degree of releasing carbon is higher than a degree of absorbing carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less. As a result, the optical characteristic can be prevented from degrading due to contamination, with an organic substance, of the surface of the illumination optical system, the reflecting mask or the reduction projection optical system.

In the first soft X-ray reduction projection exposure system, the controlling means preferably reduces a pressure in at least one of the first region, the second region and the third region individually.

Thus, the partial pressure of the carbon compound gas can be controlled in a short period of time in any particular region where the partial pressure of the carbon compound gas is desired to be controlled to be $1.33 \times 10^{-8}$ Pa or less among the first region, the second region and the third region.

In the first soft X-ray reduction projection exposure system, the controlling means preferably controls a total pressure to be $1.33 \times 10^{-4}$ Pa or less in any region where the partial pressure of the gas of the carbon compound is controlled to be $1.33 \times 10^{-8}$ Pa or less among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The second soft X-ray reduction projection exposure system of this invention comprises a light source for generating a soft X-ray beam of a wavelength of a 4 through 20 nm band; a reflecting mask on which a desired pattern is formed; an illumination optical system for irradiating the reflecting mask with the soft X-ray beam; a reduction projection optical system for imaging the pattern of the reflecting mask on a wafer; and capturing means for capturing a carbon compound generated in at least one of a first region where the illumination optical system is disposed, a second region where the reflecting mask is disposed and a third region where the reduction projection optical system is disposed.

In the second soft X-ray reduction projection exposure system, the capturing means captures the carbon compound generated in at least one of the first region where the illumination optical system is disposed, the second region where the reflecting mask is disposed and the third region where the reduction projection optical system is disposed. Therefore, the thickness of a carbon film deposited on the surface of the illumination optical system disposed in the first region, the surface of the reflecting mask disposed in the second region or the surface of the reduction projection optical system disposed in the third region can be suppressed. Accordingly, the optical characteristic can be prevented from degrading due to the contamination, with an organic substance, of the surface of the illumination optical system, the reflecting mask or the reduction projection optical system.

In the second soft X-ray reduction projection exposure system, the capturing means is preferably a filter cooled with liquid helium or liquid nitrogen.

Thus, the carbon compound generated in the first region, the second region or the third region can be definitely captured.

In the second soft X-ray reduction projection exposure system, the capturing means preferably captures the carbon compound in at least one of the first region, the second region and the third region individually.

Thus, the carbon compound can be definitely captured in any particular region where the carbon compound is desired to be captured among the first region, the second region and the third region.

In the first or second soft X-ray reduction projection exposure system, the carbon compound is preferably any of a hydrocarbon such as methane, ethane or propane, a straight-chain organic substance such as isopropyl alcohol or polymethyl methacrylate and a cyclic organic substance such as benzene or phthalate.

Thus, the organic substance that may contaminate the surface of the illumination optical system, the reflecting mask or the reduction projection optical system to degrade the optical characteristic can be definitely reduced.

The third soft X-ray reduction projection exposure system of this invention comprises a light source for generating a soft X-ray beam of a wavelength of a 4 through 20 nm band; a reflecting mask on which a desired pattern is formed; an illumination optical system for irradiating the reflecting mask with the soft X-ray beam; a reduction projection optical system for imaging the pattern of the reflecting mask on a wafer; and controlling means for controlling a partial pressure of an oxygen gas to be $1.33 \times 10^{-4}$ Pa through $1.33 \times 10^{-1}$ Pa in at least one of a first region where the illumination optical system is disposed, a second region where the reflecting mask is disposed and a third region where the reduction projection optical system is disposed.

In the third soft X-ray reduction projection exposure system, the controlling means controls the partial pressure of the oxygen gas to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to 0.1 nm or less.

Also, since the controlling means controls the partial pressure of the oxygen gas to be $1.33 \times 10^{-1}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the third soft X-ray reduction projection exposure system, the optical characteristic can be prevented from degrading due to the contamination, with an organic substance, of the surface of the illumination optical system, the reflecting mask or the reduction projection optical system without increasing the transmittance loss of the soft X-ray beam.

In the third soft X-ray reduction projection exposure system, the controlling means preferably controls a total pressure to be $1.33 \times 10^{-1}$ Pa or less in any region where the partial pressure of the oxygen gas is controlled to be $1.33 \times 10^{-4}$ Pa through $1.33 \times 10^{-1}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The fourth soft X-ray reduction projection exposure system of this invention comprises a light source for generating a soft X-ray beam of a wavelength of a 4 through 20 nm band; a reflecting mask on which a desired pattern is formed; an illumination optical system for irradiating the reflecting mask with the soft X-ray beam; a reduction projection optical system for imaging the pattern of the reflecting mask on a wafer; and controlling means for controlling a partial pressure of an ozone gas to be $1.33 \times 10^{-4}$ Pa through $4.00 \times 10^{-2}$ Pa in at least one of a first region where the illumination optical system is disposed, a second region where the reflecting mask is disposed and a third region where the reduction projection optical system is disposed.

In the fourth soft X-ray reduction projection exposure system, the controlling means controls the partial pressure of the ozone gas to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less.

Also, since the controlling means controls the partial pressure of the ozone gas to be $4.00\times10^{-2}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the fourth soft X-ray reduction projection exposure system, the optical characteristic can be prevented from degrading due to the contamination, with an organic substance, of the surface of the illumination optical system, the reflecting mask or the reduction projection optical system without increasing the transmittance loss of the soft X-ray beam.

In the fourth soft X-ray reduction projection exposure system, the controlling means preferably controls a total pressure to be $4.00\times10^{-2}$ Pa or less in any region where the partial pressure of the ozone gas is controlled to be $1.33\times10^{-4}$ Pa through $4.00\times10^{-2}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The first soft X-ray reduction projection exposure method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a wafer; and a controlling step of controlling a partial pressure of a gas of a carbon compound to be $1.33\times10^{-8}$ Pa or less in at least one of a first region where the illumination optical system is disposed, a second region where the reflecting mask is disposed and a third region where the reduction projection optical system is disposed.

In the first soft X-ray reduction projection exposure method, the partial pressure of the gas of the carbon compound is controlled, in the controlling step, to be $1.33\times10^{-8}$ Pa or less in at least one of the first region where the illumination optical system is disposed, the second region where the reflecting mask is disposed and the third region where the reduction projection optical system is disposed. Therefore, a degree of releasing carbon is higher than a degree of absorbing carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less. As a result, the optical characteristic can be prevented from degrading due to contamination, with an organic substance, of the surface of the illumination optical system, the reflecting mask or the reduction projection optical system.

In the first soft X-ray reduction projection exposure method, the controlling step preferably includes a sub-step of reducing a pressure in at least one of the first region, the second region and the third region individually.

Thus, the partial pressure of the carbon compound gas can be controlled in a short period of time in any particular region where the partial pressure of the carbon compound gas is desired to be controlled to be $1.33\times10^{-8}$ Pa or less among the first region, the second region and the third region.

In the first soft X-ray reduction projection exposure method, the controlling step preferably includes a sub-step of controlling a total pressure to be $1.33\times10^{-4}$ Pa or less in any region where the partial pressure of the gas of the carbon compound is controlled to be $1.33\times10^{-8}$ Pa or less among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The second soft X-ray reduction projection exposure method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a wafer; and a capturing step of capturing a carbon compound generated in at least one of a first region where the illumination optical system is disposed, a second region where the reflecting mask is disposed and a third region where the reduction projection optical system is disposed.

In the second soft X-ray reduction projection exposure method, the carbon compound generated in at least one of the first region where the illumination optical system is disposed, the second region where the reflecting mask is disposed and the third region where the reduction projection optical system is disposed is captured in the capturing step. Therefore, the thickness of a carbon film deposited on the surface of the illumination optical system disposed in the first region, the surface of the reflecting mask disposed in the second region or the surface of the reduction projection optical system disposed in the third region can be suppressed. Accordingly, the optical characteristic can be prevented from degrading due to the contamination, with an organic substance, of the surface of the illumination optical system, the reflecting mask or the reduction projection optical system.

In the second soft X-ray reduction projection exposure method, the capturing step preferably includes a sub-step of capturing the carbon compound by using a filter cooled with liquid helium or liquid nitrogen.

Thus, the carbon compound generated in the first region, the second region or the third region can be definitely captured.

In the second soft X-ray reduction projection exposure method, the capturing step preferably includes a sub-step of capturing the carbon compound in at least one of the first region, the second region and the third region individually.

Thus, the carbon compound can be definitely captured in any particular region where the carbon compound is desired to be captured among the first region, the second region and the third region.

In the first or second soft X-ray reduction projection exposure method, the carbon compound is preferably any of a hydrocarbon such as methane, ethane or propane, a straight-chain organic substance such as isopropyl alcohol or polymethyl methacrylate, and a cyclic organic substance such as benzene or phthalate.

Thus, an organic substance that may contaminate the surface of the illumination optical system, the reflecting mask or the reduction projection optical system to degrade the optical characteristic can be definitely reduced.

The third soft X-ray reduction projection exposure method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a wafer; and a controlling step of controlling a partial pressure of an oxygen gas to be $1.33 \times 10^{-4}$ Pa through $1.33 \times 10^{-1}$ Pa in at least one of a first region where the illumination optical system is disposed, a second region where the reflecting mask is disposed and a third region where the reduction projection optical system is disposed.

In the third soft X-ray reduction projection exposure method, the partial pressure of the oxygen gas is controlled, in the controlling step, to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to 0.1 nm or less.

Also, since the partial pressure of the oxygen gas is controlled, in the controlling step, to be $1.33 \times 10^{-1}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the third soft X-ray reduction projection exposure method, the optical characteristic can be prevented from degrading due to the contamination, with an organic substance, of the surface of the illumination optical system, the reflecting mask or the reduction projection optical system without increasing the transmittance loss of the soft X-ray beam.

In the third soft X-ray reduction projection exposure method, the controlling step preferably includes a sub-step of controlling a total pressure to be $1.33 \times 10^{-1}$ Pa or less in any region where the partial pressure of the oxygen gas is controlled to be $1.33 \times 10^{-4}$ Pa through $1.33 \times 10^{-1}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The fourth soft X-ray reduction projection exposure method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a wafer; and a controlling step of controlling a partial pressure of an ozone gas to be $1.33 \times 10^{-4}$ Pa through $4.00 \times 10^{-2}$ Pa in at least one of a first region where the illumination optical system is disposed, a second region where the reflecting mask is disposed and a third region where the reduction projection optical system is disposed.

In the fourth soft X-ray reduction projection exposure method, the partial pressure of the ozone gas is controlled, in the controlling step, to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less.

Also, since the partial pressure of the ozone gas is controlled, in the controlling step, to be $4.00 \times 10^{-2}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the fourth soft X-ray reduction projection exposure method, the optical characteristic can be prevented from degrading due to the contamination, with an organic substance, of the surface of the illumination optical system, the reflecting mask or the reduction projection optical system without increasing the transmittance loss of the soft X-ray beam.

In the fourth X-ray reduction projection exposure method, the controlling step preferably includes a sub-step of controlling a total pressure to be $4.00 \times 10^{-2}$ Pa or less in any region where the partial pressure of the oxygen gas is controlled to be $1.33 \times 10^{-4}$ Pa through $4.00 \times 10^{-2}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The first pattern formation method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a resist film; a step of forming a resist pattern by developing the resist film on which the pattern of the reflecting mask has been imaged; and a controlling step of controlling a partial pressure of a gas of a carbon compound to be $1.33 \times 10^{-8}$ Pa or less in at least one of a first region where the illumination optical system is disposed, a second region where the reflecting mask is disposed and a third region where the reduction projection optical system is disposed.

In the first pattern formation method, the partial pressure of the gas of the carbon compound is controlled, in the controlling step, to be $1.33 \times 10^{-8}$ Pa or less in at least one of the first region where the illumination optical system is disposed, the second region where the reflecting mask is disposed and the third region where the reduction projection optical system is disposed. Therefore, a degree of releasing carbon is higher than a degree of absorbing carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less. As a result, the optical characteristic can be prevented from degrading due to contamination, with an organic substance, on the surface of the illumination optical system, the reflecting mask or the reduction projection optical system.

In the first pattern formation method, the controlling step preferably includes a sub-step of reducing a pressure in at least one of the first region, the second region and the third region individually.

Thus, the partial pressure of the carbon compound gas can be controlled in a short period of time in any particular region where the partial pressure of the carbon compound gas is desired to be controlled to be $1.33 \times 10^{-8}$ Pa or less among the first region, the second region and the third region.

In the first pattern formation method, the controlling step preferably includes a sub-step of controlling a total pressure to be $1.33 \times 10^{-4}$ Pa or less in any region where the partial pressure of the gas of the carbon compound is controlled to be $1.33 \times 10^{-8}$ Pa or less among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The second pattern formation method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a resist film; a step of forming a resist pattern by developing the resist film on which the pattern of the reflecting mask has been imaged; and a capturing step of capturing a carbon compound generated in at least one of a first region where the illumination optical system is disposed, a second region where the reflecting mask is disposed and a third region where the reduction projection optical system is disposed.

In the second pattern formation method, the carbon compound generated in at least one of the first region where the illumination optical system is disposed, the second region where the reflecting mask is disposed and the third region where the reduction projection optical system is disposed is captured in the capturing step. Therefore, the thickness of a carbon film deposited on the surface of the illumination optical system disposed in the first region, the surface of the reflecting mask disposed in the second region or the surface of the reduction projection optical system disposed in the third region can be suppressed. Accordingly, the optical characteristic can be prevented from degrading due to the contamination, with an organic substance, of the surface of the illumination optical system, the reflecting mask or the reduction projection optical system.

In the second pattern formation method, the capturing step preferably includes a sub-step of capturing the carbon compound by using a filter cooled with liquid helium or liquid nitrogen.

Thus, the carbon compound generated in the first region, the second region or the third region can be definitely captured.

In the second pattern formation method, the capturing step preferably includes a sub-step of capturing the carbon compound in at least one of the first region, the second region and the third region individually.

Thus, the carbon compound can be definitely captured in any particular region where the carbon compound is desired to be captured among the first region, the second region and the third region.

In the first or second pattern formation method, the carbon compound is preferably any of a hydrocarbon such as methane, ethane or propane, a straight-chain organic substance such as isopropyl alcohol or polymethyl methacrylate, and a cyclic organic substance such as benzene or phthalate.

Thus, an organic substance that may contaminate the surface of the illumination optical system, the reflecting mask or the reduction projection optical system to degrade the optical characteristic can be definitely reduced.

The third pattern formation method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a resist film; a step of forming a resist pattern by developing the resist film on which the pattern of the reflecting mask has been imaged; and a controlling step of controlling a partial pressure of an oxygen gas to be $1.33 \times 10^{-4}$ Pa through $1.33 \times 10^{-1}$ Pa in at least one of a first region where the illumination optical system is disposed, a second region where the reflecting mask is disposed and a third region where the reduction projection optical system is disposed.

In the third pattern formation method, the partial pressure of the oxygen gas is controlled, in the controlling step, to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to 0.1 nm or less.

Also, since the partial pressure of the oxygen gas is controlled, in the controlling step, to be $1.33 \times 10^{-1}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the third pattern formation method, the optical characteristic can be prevented from degrading due to the contamination, with an organic substance, of the surface of the illumination optical system, the reflecting mask or the reduction projection optical system without increasing the transmittance loss of the soft X-ray beam.

In the third pattern formation method, the controlling step preferably includes a sub-step of controlling a total pressure to be $1.33 \times 10^{-1}$ Pa or less in any region where the partial pressure of the oxygen gas is controlled to be $1.33 \times 10^{-4}$ Pa through $1.33 \times 10^{-1}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

The fourth pattern formation method of this invention comprises a step of introducing, by an illumination optical system, a soft X-ray beam of a wavelength of a 4 through 20 nm band to a reflecting mask on which a desired pattern is formed; a step of imaging, by a reduction projection optical system, the pattern of the reflecting mask on a resist film; a step of forming a resist pattern by developing the resist film on which the pattern of the reflecting mask has been imaged; and a controlling step of controlling a partial pressure of an ozone gas to be $1.33 \times 10^{-4}$ Pa through $4.00 \times 10^{-2}$ Pa in at least one of a first region where the illumination optical system is disposed, a second region where the reflecting mask is disposed and a third region where the reduction projection optical system is disposed.

In the fourth pattern formation method, the partial pressure of the ozone gas is controlled, in the controlling step, to be $1.33 \times 10^{-4}$ Pa or more in at least one of the first region where the illumination optical system is disposed, the second region where the reflecting mask is disposed and the third region where the reduction projection optical system is disposed. Therefore, a degree of releasing carbon through oxidation/decomposition is higher than a degree of adhering carbon on the surface of the illumination optical system disposed in the first region, the surface of the reflecting mask disposed in the second region or the surface of the reduction projection optical system disposed in the third region. Accordingly, the thickness of a carbon film deposited on the surface of the illumination optical system, the reflecting mask or the reduction projection optical system can be suppressed to approximately 0.1 nm or less.

Also, since the partial pressure of the ozone gas is controlled, in the controlling step, to be $4.00 \times 10^{-2}$ Pa or less, the transmittance loss per meter of the soft X-ray beam can be suppressed to 1% or less. Therefore, the proportion of the soft X-ray beam generated by the light source to reach the wafer cannot be lowered.

Accordingly, in the fourth pattern formation method, the optical characteristic can be prevented from degrading due to the contamination, with an organic substance, of the surface of the illumination optical system, the reflecting mask or the reduction projection optical system without increasing the transmittance loss of the soft X-ray beam.

In the fourth pattern formation method, the controlling step preferably includes a sub-step of controlling a total pressure to be $4.00 \times 10^{-2}$ Pa or less in any region where the partial pressure of the oxygen gas is controlled to be $1.33 \times 10^{-4}$ Pa through $4.00 \times 10^{-2}$ Pa among the first region, the second region and the third region.

Thus, the thickness of a carbon film deposited on the surface of the illumination optical system, the reflecting mask or the reduction projection optical system can be suppressed to approximately 0.1 nm or less, and in addition, the surface of the illumination optical system, the reflecting mask or the reduction projection optical system can be prevented from being contaminated with an inorganic substance.

DETAILED DESCRIPTION OF THE INVENTION

Embodiment 1

A soft X-ray reduction projection exposure system and a soft X-ray reduction projection exposure method according to Embodiment 1 of the invention will now be described with reference to FIG. 1.

Figure 1:
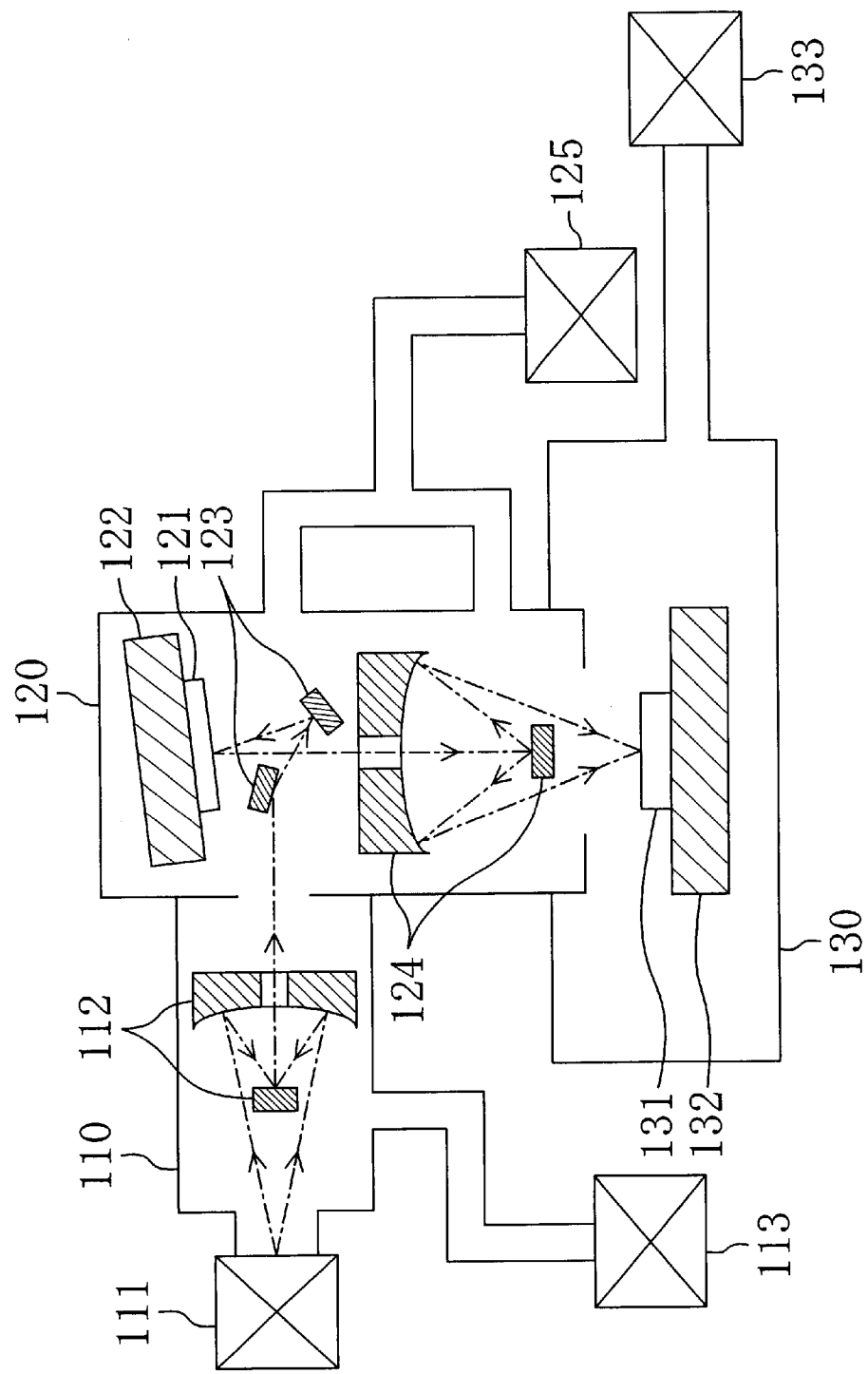
FIG. 1 is a rough cross-sectional view of a soft X-ray reduction projection exposure system according to Embodiment 1 of the invention.

FIG. 1 is a rough cross-sectional view of the soft X-ray reduction projection exposure system of Embodiment 1, which includes a first chamber 110, a second chamber 120 and a third chamber 130 communicating with one another.

The first chamber 110 includes a discharge type X-ray source 111 for generating a soft X-ray beam, an illumination optical system 112 for transmitting the soft X-ray beam generated by the discharge type X-ray source 111 to the second chamber 120, and a first diffusion pump 113 for reducing the pressure within the first chamber 110.

The second chamber 120 includes a reflecting mask 121 on which a desired pattern is formed, a mask stage 122 for holding the reflecting mask 121, a reflecting optical system 123 for introducing the soft X-ray beam having been transmitted from the illumination optical system 112 of the first chamber 110 to the reflecting mask 121, a reduction projection optical system 124 for reducing the soft X-ray beam having been reflected by the reflecting mask 121 and transmitting the reduced soft X-ray beam to the third chamber 130, and a second diffusion pump 125 for reducing the pressure within the second chamber 120.

The third chamber 130 includes a wafer 131 on which a pattern is to be formed, a wafer stage 132 for holding the wafer 131, and a third diffusion pump 133 for reducing the pressure within the third chamber 130. The soft X-ray beam transmitted from the reduction projection optical system 124 of the second chamber 120 to the third chamber 130 irradiate the surface of the wafer 131.

The total pressure within the first chamber 110 can be controlled down to $1.33 \times 10^{-8}$ Pa by the first diffusion pump 113, the total pressure within the second chamber 120 can be controlled down to $1.33 \times 10^{-8}$ Pa by the second diffusion pump 125 and the total pressure within the third chamber 130 can be controlled down to $1.33 \times 10^{-8}$ Pa by the third diffusion pump 133.

As a characteristic of Embodiment 1, the partial pressure of a carbon compound gas within the first chamber 110 is controlled to be $1.33 \times 10^{-8}$ Pa or less by the first diffusion pump 113, the partial pressures of the carbon compound gas within a region where the reflecting mask 121 is disposed and a region where the reduction projection optical system 124 is disposed in the second chamber 120 are respectively controlled to be $1.33 \times 10^{-8}$ Pa or less by the second diffusion pump 125, and the partial pressure of the carbon compound gas within the third chamber 130 is controlled to be $1.33 \times 10^{-8}$ Pa or less by the third diffusion pump 133.

Figure 2:
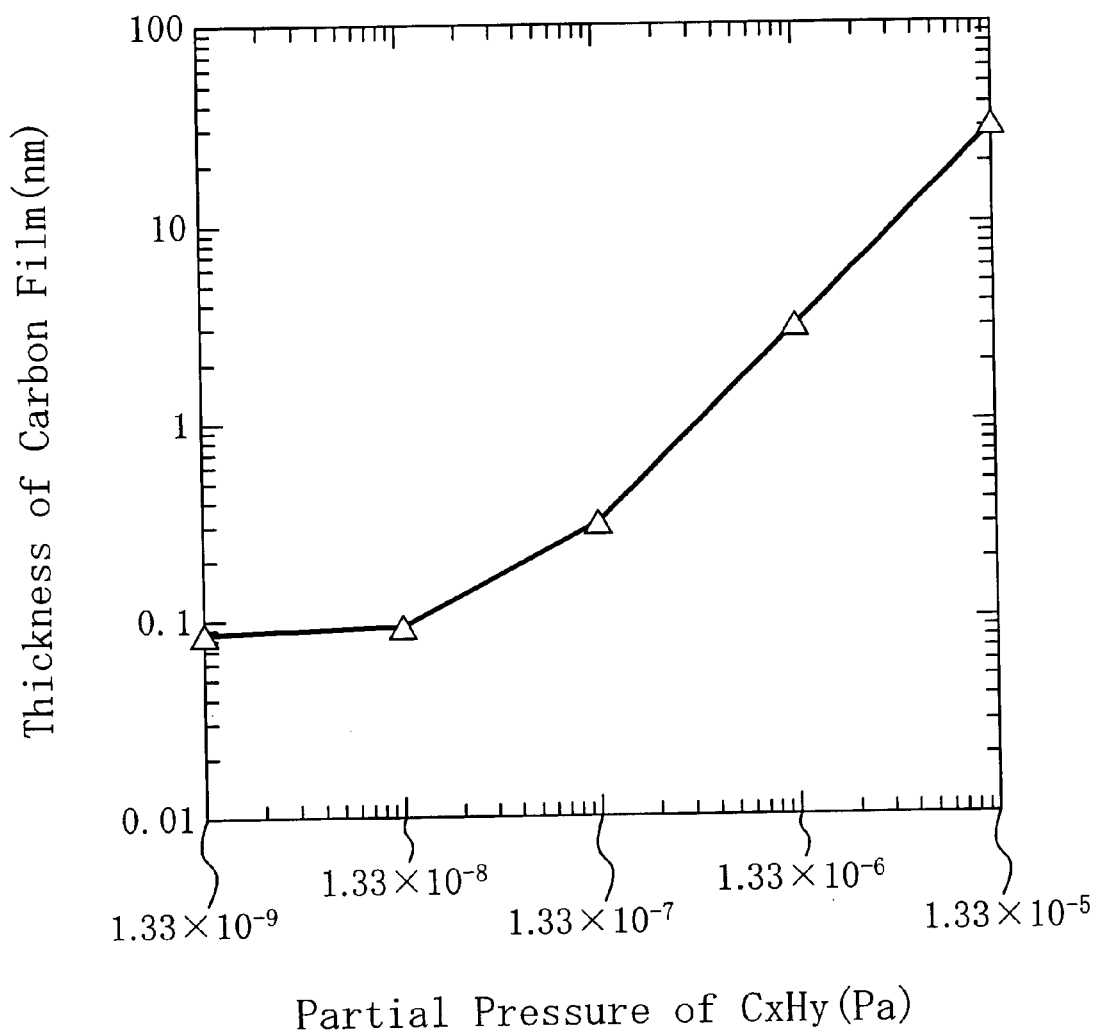
FIG. 2 is a diagram for showing the relationship, obtained by introducing a soft X-ray beam having been reflected by a reflecting mask to a reduction projection optical system in the soft X-ray reduction projection exposure system of Embodiment 1, between the partial pressure of a hydrocarbon gas in the vicinity of the reduction projection optical system and the thickness of a carbon film adhered onto a reflecting face of the reduction projection optical system.

FIG. 2 shows the relationship between the partial pressure of a hydrocarbon ($C_xH_y$) gas in the vicinity of the reduction projection optical system 124 and the thickness of a carbon film adhered onto a reflecting face of the reduction projection optical system 124 obtained by introducing the soft X-ray beam having been reflected by the reflecting mask 121 to the reduction projection optical system 124 continuously for 24 hours in the soft X-ray reduction projection exposure system of FIG. 1. In FIG. 2, points shown with $\Delta$ indicate actually measured values and a solid line is a virtual line obtained on the basis of these actually measured values.

As is obvious from FIG. 2, in the case where the partial pressure of the hydrocarbon gas is higher than $1.33 \times 10^{-8}$ Pa, the thickness of the carbon film deposited on the surface of the reduction projection optical system 124 through the irradiation with the soft X-ray beam is abruptly increased. In contrast, in the case where the partial pressure of the hydrocarbon gas is $1.33 \times 10^{-8}$ Pa or less, the thickness of the deposited carbon film is approximately 0.1 nm.

The thickness of the deposited carbon film largely depends upon the partial pressure of the hydrocarbon gas. In the case where the partial pressure of the hydrocarbon gas is higher than $1.33 \times 10^{-8}$ Pa, a degree of carbon adhering onto the surface of the reduction projection optical system 124 is higher than a degree of carbon releasing from the surface of the reduction projection optical system 124, so that the thickness of the carbon film can be increased.

In contrast, in the case where the partial pressure of the hydrocarbon gas is $1.33 \times 10^{-8}$ Pa or less, the degree of carbon releasing from the reduction projection optical system 124 is higher than the degree of carbon adhering onto the reduction projection optical system 124, so that the thickness of the carbon film cannot be increased. In other words, in the case where the partial pressure of the hydrocarbon gas is $1.33 \times 10^{-8}$ Pa or less, the thickness of the carbon film does not exceed 0.1 nm. Also, when the thickness of the carbon film is approximately 0.1 nm, lowering of the reflectance of the reduction projection optical system 124 can be suppressed to approximately 0.1%, which does not cause any practical problem.

According to Embodiment 1 of the invention, the thickness of the carbon film deposited on the reflecting face of the reduction projection optical system 124 can be suppressed to approximately 0.1 nm because the partial pressure of the hydrocarbon gas is controlled to be $1.33 \times 10^{-8}$ Pa or less, and therefore, the optical characteristic can be prevented from degrading due to contamination of the reflecting face of the reduction projection optical system 124 with an organic substance.

In this embodiment, the relationship between the partial pressure of the hydrocarbon gas within the region where the reduction projection optical system 124 is disposed in the second chamber 120 and the thickness of the carbon film deposited on the surface of the reduction projection optical system 124 is described. This relationship also holds between the partial pressure of the hydrocarbon gas within the region where the illumination optical system 112 is disposed in the first chamber 110 and the thickness of a carbon film deposited on the surface of the illumination optical system 112 and between the partial pressure of the hydrocarbon gas within the region where the reflecting mask 121 is disposed in the second chamber 120 and the thickness of a carbon film deposited on the surface of the reflecting mask 121. Specifically, the partial pressure of the hydrocarbon gas within the region where the illumination optical system 112 is disposed in the first chamber 110 and the partial pressure of the hydrocarbon gas within the region where the reflecting mask 121 is disposed in the second chamber 120 are respectively controlled to be $1.33 \times 10^{-8}$ Pa or less, and hence, the thicknesses of the carbon films deposited on the reflecting faces of the illumination optical system 112 and the reflecting mask 121 can be suppressed to approximately 0.1 nm.

In Embodiment 1, the partial pressure of the hydrocarbon gas is controlled to be $1.33 \times 10^{-8}$ Pa or less. Alternatively, the partial pressure of a gas of any of hydrocarbons such as methane, ethane and propane, straight-chain organic substances such as isopropyl alcohol and polymethyl methacrylate, and cyclic organic substances such as benzene and phthalate may be controlled in order to suppress the thickness of the carbon film to approximately 0.1 nm.

Although the partial pressure of the hydrocarbon gas is controlled to be $1.33 \times 10^{-8}$ Pa or less in all of the inside region of the first chamber 110 and the regions where the reflecting mask 121 and the reduction projection optical system 124 are respectively disposed in the second chamber 120 in Embodiment 1, the partial pressure of the hydrocarbon gas may be controlled to be $1.33 \times 10^{-8}$ Pa or less in at least one of these regions.

As a characteristic of Embodiment 1, the total pressure within the first chamber 110 is controlled to be $1.33 \times 10^{-4}$ Pa or less by the first diffusion pump 113 and the total pressures within the regions where the reflecting mask 121 and the reduction projection optical system 124 are respectively disposed in the second chamber 120 are controlled to be $1.33 \times 10^{-4}$ Pa by the second diffusion pump 125.

Since the total pressure within the first chamber 110 and the total pressures within the regions where the reflecting mask 121 and the reduction projection optical system 124 are respectively disposed in the second chamber 120 are thus controlled to be $1.33 \times 10^{-4}$ Pa or less, any gas other than the hydrocarbon gas, such as a gas of an inorganic substance like a metal element, can be suppressed. Therefore, the optical characteristics can be prevented from degrading due to the contamination, with an inorganic substance, of the reflecting faces of the illumination optical system 112, the reflecting mask 121 and the reduction projection optical system 124.

In Embodiment 1, the total pressure and the partial pressure of the hydrocarbon gas within the first chamber 110 are controlled by the first diffusion pump 113, and the total pressure within the second chamber 120 and the partial pressures of the hydrocarbon gas within the regions where the reflecting mask 121 and the reduction projection optical system 124 are respectively disposed are controlled by the second diffusion pump 125. These diffusion pumps may be provided to the respective chambers or the respective regions, or a common diffusion pump may be provided to a plurality of chambers or a plurality of regions.

In particular, the partial pressure of the hydrocarbon gas within the region of the reflecting mask 121 is disposed in the second chamber 120 and the partial pressure of the hydrocarbon gas within the region where the reduction projection optical system 124 is disposed in the second chamber 120 are both controlled by the second diffusion pump 125 in Embodiment 1. However, the partial pressures of the hydrocarbon gas within the region where the reflecting mask 121 is disposed and within the region where the reduction projection optical system 124 is disposed are preferably individually controlled by different diffusion pumps.

Although the discharge type X-ray source 111 is used as the soft X-ray source in Embodiment 1, another soft X-ray source such as a laser induced plasma X-ray source may be used instead.

Also, although the reflecting mirrors are used as the illumination optical system 112 and the reduction projection optical system 124 in Embodiment 1, another means may be employed instead.

Furthermore, although the diffusion pumps are used as pressure reducing means in Embodiment 1, another vacuum pumping device such as a turbo pump or an ion pump may be used instead.

Embodiment 2

A soft X-ray reduction projection exposure system and a soft X-ray reduction projection exposure method according to Embodiment 2 of the invention will now be described with reference to FIG. 3.

Figure 3:
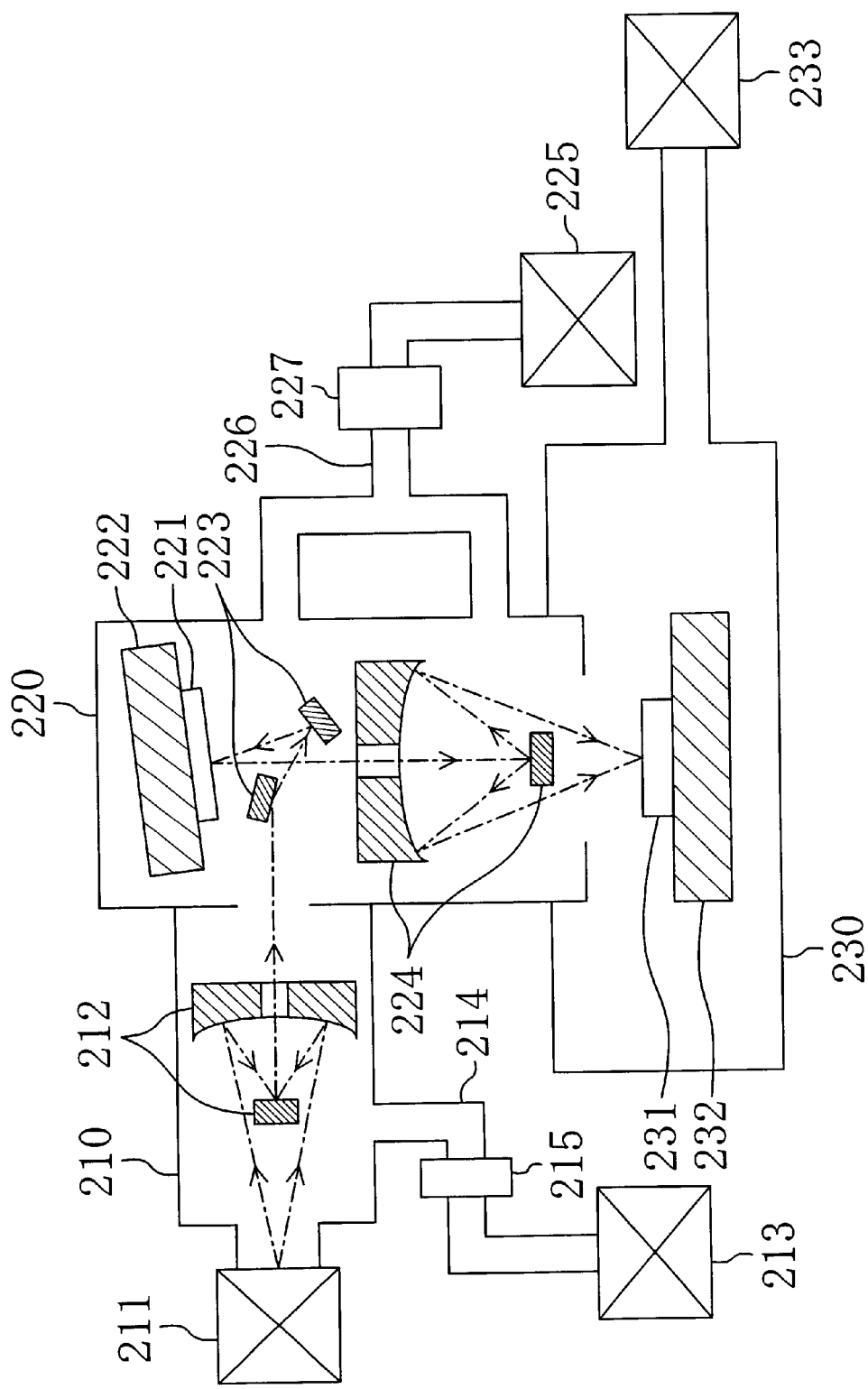
FIG. 3 is a rough cross-sectional view of a soft X-ray reduction projection exposure system according to Embodiment 2 of the invention.

FIG. 3 is a rough cross-sectional view of the soft X-ray reduction projection exposure system of Embodiment 2, which includes a first chamber 210, a second chamber 220 and a third chamber 230 communicating with one another.

The first chamber 210 includes a discharge type X-ray source 211 for generating a soft X-ray beam, an illumination optical system 212 for transmitting the soft X-ray beam generated by the discharge type X-ray source 211 to the second chamber 220, a first diffusion pump 213 for reducing the pressure within the first chamber 210, and a first organic substance trap 215 disposed in a first pressure reducing path 214 connecting the first chamber 210 to the first diffusion pump 213.

The second chamber 220 includes a reflecting mask 221 on which a desired pattern is formed, a mask stage 222 for holding the reflecting mask 221, a reflecting optical system 223 for introducing the soft X-ray beam having been transmitted from the illumination optical system 212 of the first chamber 210 to the reflecting mask 221, a reduction projection optical system 224 for reducing the soft X-ray beam having been reflected by the reflecting mask 221 and transmitting the reduced soft X-ray beam to the third chamber 230, a second diffusion pump 225 for reducing the pressure within the second chamber 220, and a second organic substance trap 227 disposed in a second pressure reducing path 216 connecting the second chamber 220 to the second diffusion pump 225.

The third chamber 230 includes a wafer 231 on which a pattern is to be formed, a wafer stage 232 for holding the wafer 231, and a third diffusion pump 233 for reducing the pressure within the third chamber 230. The soft X-ray beam transmitted from the reduction projection optical system 224 of the second chamber 220 to the third chamber 230 irradiate the surface of the wafer 231.

The first organic substance trap 215 and the second organic substance trap 227 are both cooled with liquid helium and respectively include filters for capturing a carbon compound generated in the first chamber 210 and the second chamber 220.

The total pressure within the first chamber 210 can be controlled down to $1.33 \times 10^{-8}$ Pa by the first diffusion pump 213, the total pressure within the second chamber 220 can be controlled down to $1.33 \times 10^{-8}$ Pa by the second diffusion pump 225 and the total pressure within the third chamber 230 can be controlled down to $1.33 \times 10^{-8}$ Pa by the third diffusion pump 233.

Similarly to Embodiment 1, the partial pressure of a carbon compound gas within the first chamber 210 is controlled to be $1.33 \times 10^{-8}$ Pa or less by the first diffusion pump 213, the partial pressures of the carbon compound gas within a region where the reflecting mask 221 is disposed and a region where the reduction projection optical system 224 is disposed in the second chamber 220 are respectively controlled to be $1.33 \times 10^{-8}$ Pa or less by the second diffusion pump 225, and the partial pressure of the carbon compound gas within the third chamber 230 is controlled to be $1.33 \times 10^{-8}$ Pa or less by the third diffusion pump 233.

As a characteristic of Embodiment 2, the first organic substance trap 215 is disposed in the first pressure reducing path 214 connecting the first chamber 210 to the first diffusion pump 213 and the second organic substance trap 227 is disposed in the second pressure reducing path 216 connecting the second chamber 220 to the second diffusion pump 225. Therefore, the partial pressure of the carbon compound gas within the first chamber 210 can be rapidly controlled to be $1.33 \times 10^{-8}$ Pa or less, and the partial pressures of the carbon compound gas within the regions where the reflecting mask 221 and the reduction projection optical system 224 are disposed in the second chamber 220 can be rapidly controlled to be $1.33 \times 10^{-8}$ Pa or less.

Therefore, according to Embodiment 2, the thickness of a carbon film deposited on the surface of the illumination optical system 212, the thickness of a carbon film deposited on the surface of the reflecting mask 221 and the thickness of a carbon film deposited on the surface of the reduction projection optical system 224 can be all suppressed to approximately 0.1 nm. Accordingly, the optical characteristics can be prevented from degrading due to the contamination, with an organic substance, of the reflecting faces of the illumination optical system 212, the reflecting mask 221 and the reduction projection optical system 224.

In Embodiment 2, the partial pressure of the carbon compound gas is controlled to be $1.33 \times 10^{-8}$ Pa or less in the inside region of the first chamber 210, the region where the reflecting mask 221 is disposed in the second chamber 220 and the region where the reduction projection optical system 224 is disposed in the second chamber 220. Instead, the partial pressure of the carbon compound gas may be higher than $1.33 \times 10^{-8}$ Pa in the inside region of the first chamber 210, the region where the reflecting mask 221 is disposed in the second chamber 220 and the region where the reduction projection optical system 224 is disposed in the second chamber 220. In this case, a carbon compound generated in the inside region of the first chamber 210 is captured by the first organic substance trap 215, and a carbon compound generated in the regions where the reflecting mask 221 and the reduction projection optical system 224 are disposed in the second chamber 220 is captured by the second organic substance trap 227.

Thus, the carbon compound is captured by the first organic substance trap 215 and the second organic substance trap 227, and hence, the thicknesses of the carbon films deposited on the surfaces of the illumination optical system 212, the reflecting mask 221 and the reduction projection optical system 224 can be reduced. Therefore, the optical characteristics can be prevented from degrading due to the contamination, with the organic substance, of the illumination optical system 212, the reflecting mask 221 and the reduction projection optical system 224.

Although the filters cooled with liquid helium are used in the first organic substance trap 215 and the second organic substance trap 227 in Embodiment 2, any other device capable of capturing an organic substance, such as a filter cooled with liquid nitrogen, may be used instead.

Also, the first organic substance trap 215 is disposed between the first chamber 210 and the first diffusion pump 213 and the second organic substance trap 227 is disposed between the second chamber 220 and the second diffusion pump 225 in Embodiment 2. Alternatively, the first organic substance trap 215 may be disposed in a branch path branching from the first pressure reducing path 214 and the second organic substance trap 227 may be disposed in a branch path branching from the second pressure reducing path 216.

Furthermore, the partial pressure of the carbon compound gas is controlled to be $1.33 \times 10^{-8}$ Pa or less and hydrocarbon is captured in Embodiment 2. The carbon compound may be any of hydrocarbons such as methane, ethane and propane, straight-chain organic substances such as isopropyl alcohol and polymethyl methacrylate, and cyclic organic substances such as benzene and phthalate. The thickness of the carbon film can be suppressed to approximately 0.1 nm by controlling the partial pressure of the hydrocarbon, the straight-chain organic substance or the cyclic organic substance, and the thickness of the carbon film can be suppressed by capturing the hydrocarbon, the straight-chain organic substance or the cyclic organic substance.

Also, the partial pressure of the carbon compound gas is controlled to be $1.33 \times 10^{-8}$ Pa or less in all of the inside region of the first chamber 210, the region where the reflecting mask 221 is disposed in the second chamber 220 and the region where the reduction projection optical system 224 is disposed in the second chamber 220 in Embodiment 2. Alternatively, the partial pressure of the carbon compound gas may be controlled to be $1.33 \times 10^{-8}$ Pa or less at least in one of these regions.

Also in Embodiment 2, similarly to Embodiment 1, the total pressure within the first chamber 210 is preferably controlled to be $1.33 \times 10^{-4}$ Pa or less by the first diffusion pump 213 and the total pressure within the second chamber 220 is preferably controlled to be $1.33 \times 10^{-4}$ Pa or less by the second diffusion pump 225.

Thus, the optical characteristics can be prevented from degrading due to contamination, with an inorganic substance such as a metal element, of the reflecting faces of the illumination optical system 212, the reflecting mask 221 and the reduction projection optical system 224.

In Embodiment 2, the total pressure and the partial pressure of the hydrocarbon gas within the first chamber 210 are controlled by the first diffusion pump 213, and the total pressure within the second chamber 220 and the partial pressures of the hydrocarbon gas within the regions where the reflecting mask 221 and the reduction projection optical system 224 are disposed are controlled by the second diffusion pump 225. These diffusion pumps may be provided to the respective chambers or the respective regions, or a common diffusion pump may be provided to a plurality of chambers or a plurality of regions.

In particular, the partial pressure of the hydrocarbon gas within the region where the reflecting mask 221 is disposed in the second chamber 220 and the partial pressure of the hydrocarbon gas within the region where the reduction projection optical system 224 is disposed in the second chamber 220 are both controlled by the second diffusion pump 225 in Embodiment 2. However, the partial pressures of the hydrocarbon gas within the region where the reflecting mask 221 is disposed and within the region where the reduction projection optical system 224 is disposed are preferably individually controlled by different diffusion pumps.

Furthermore, the carbon compound generated in the region where the reflecting mask 221 is disposed in the second chamber 220 and the carbon compound generated in the region where the reduction projection optical system 224 is disposed in the second chamber 220 are captured preferably by different organic substance traps.

Although the discharge type X-ray source 211 is used as the soft X-ray source in Embodiment 2, another soft X-ray source such as a laser induced plasma X-ray source may be used instead.

Also, although the reflecting mirrors are used as the illumination optical system 212 and the reduction projection optical system 224 in Embodiment 2, another means may be employed instead.

Furthermore, although the diffusion pumps are used as pressure reducing means in Embodiment 2, another vacuum pumping device such as a turbo pump or an ion pump may be used instead.

Embodiment 3

A soft X-ray reduction projection exposure system and a soft X-ray reduction projection exposure method according to Embodiment 3 of the invention will now be described with reference to FIG. 4.

Figure 4:
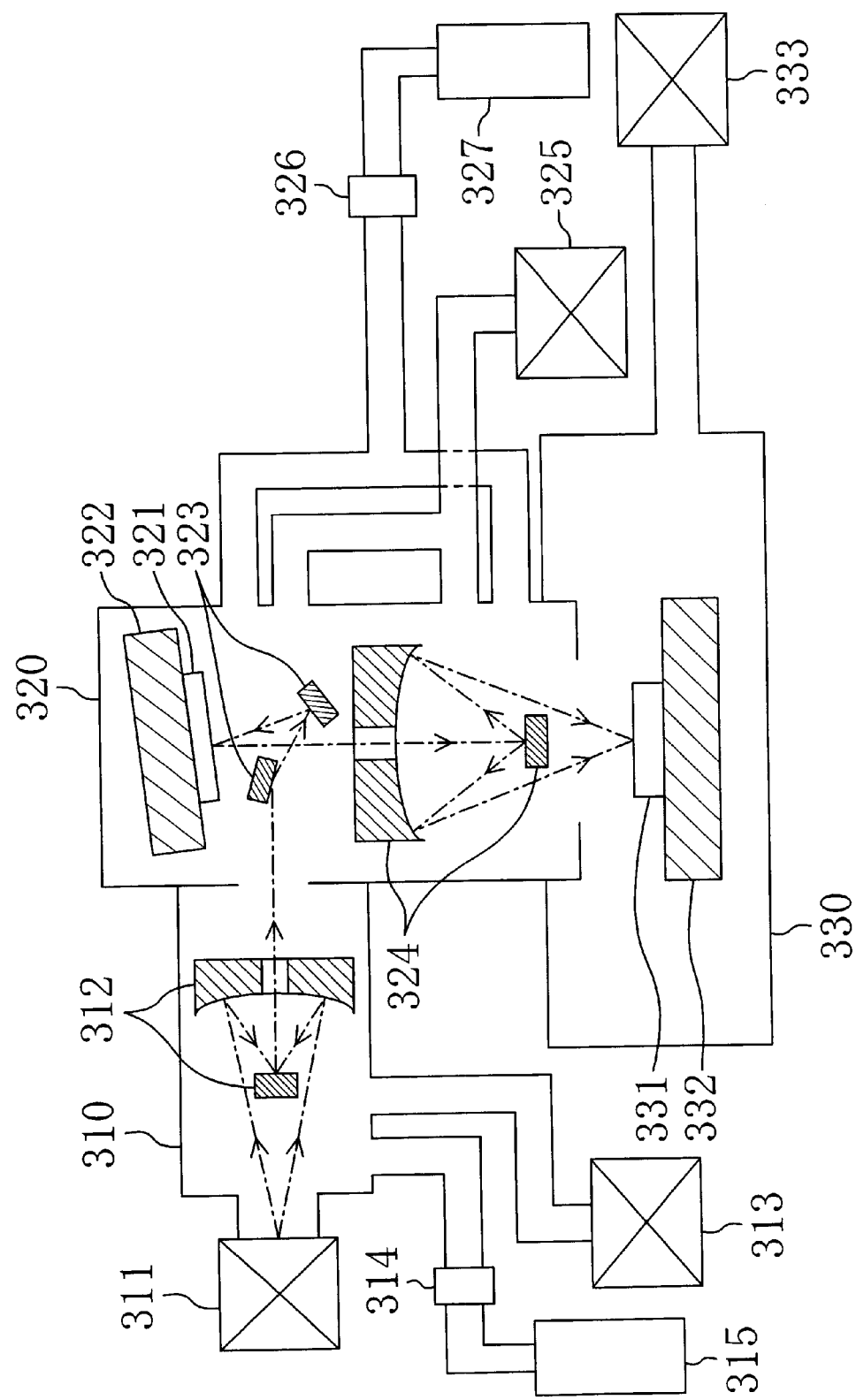
FIG. 4 is a rough cross-sectional view of a soft X-ray reduction projection exposure system according to Embodiment 3 of the invention.

FIG. 4 is a rough cross-sectional view of the soft X-ray reduction projection exposure system of Embodiment 3, which includes a first chamber 310, a second chamber 320 and a third chamber 330 communicating with one another.

The first chamber 310 includes a discharge type X-ray source 311 for generating a soft X-ray beam, an illumination optical system 312 for transmitting the soft X-ray beam generated by the discharge type X-ray source 311 to the second chamber 320, a first diffusion pump 313 for reducing the pressure within the first chamber 310, and a first oxygen cylinder 315 serving as first oxygen gas supply means for supplying an oxygen gas not ionized to the first chamber 310 through a first massflow controller 314 for controlling the flow rate of the oxygen gas.

The second chamber 320 includes a reflecting mask 321 on which a desired pattern is formed, a mask stage 322 for holding the reflecting mask 321, a reflecting optical system 323 for introducing the soft X-ray beam having been transmitted from the illumination optical system 312 of the first chamber 310 to the reflecting mask 321, a reduction projection optical system 324 for reducing the soft X-ray beam having been reflected by the reflecting mask 321 and transmitting the reduced soft X-ray beam to the third chamber 330, a second diffusion pump 325 for reducing the pressure within the second chamber 320, and a second oxygen cylinder 327 serving as second oxygen gas supply means for supplying an oxygen gas not ionized to the second chamber 320 through a second massflow controller 326 for controlling the flow rate of the oxygen gas.

The third chamber 330 includes a wafer 331 on which a pattern is to be formed, a wafer stage 332 for holding the wafer 331, and a third diffusion pump 333 for reducing the pressure within the third chamber 330. The soft X-ray beam transmitted from the reduction projection optical system 324 of the second chamber 320 to the third chamber 330 irradiate the surface of the wafer 331.

As a characteristic of Embodiment 3, the partial pressure of the oxygen gas within the first chamber 310 is controlled to be $1.33 \times 10^{-4}$ Pa through $1.33 \times 10^{-1}$ Pa by the first diffusion pump 313 and the first massflow controller 314, and the partial pressures of the oxygen gas within regions where the reflecting mask 321 and the reduction projection optical system 324 are disposed in the second chamber 320 are controlled to be $1.33 \times 10^{-4}$ Pa through $1.33 \times 10^{-1}$ Pa by the second diffusion pump 325 and the second massflow controller 326.

Figure 5:
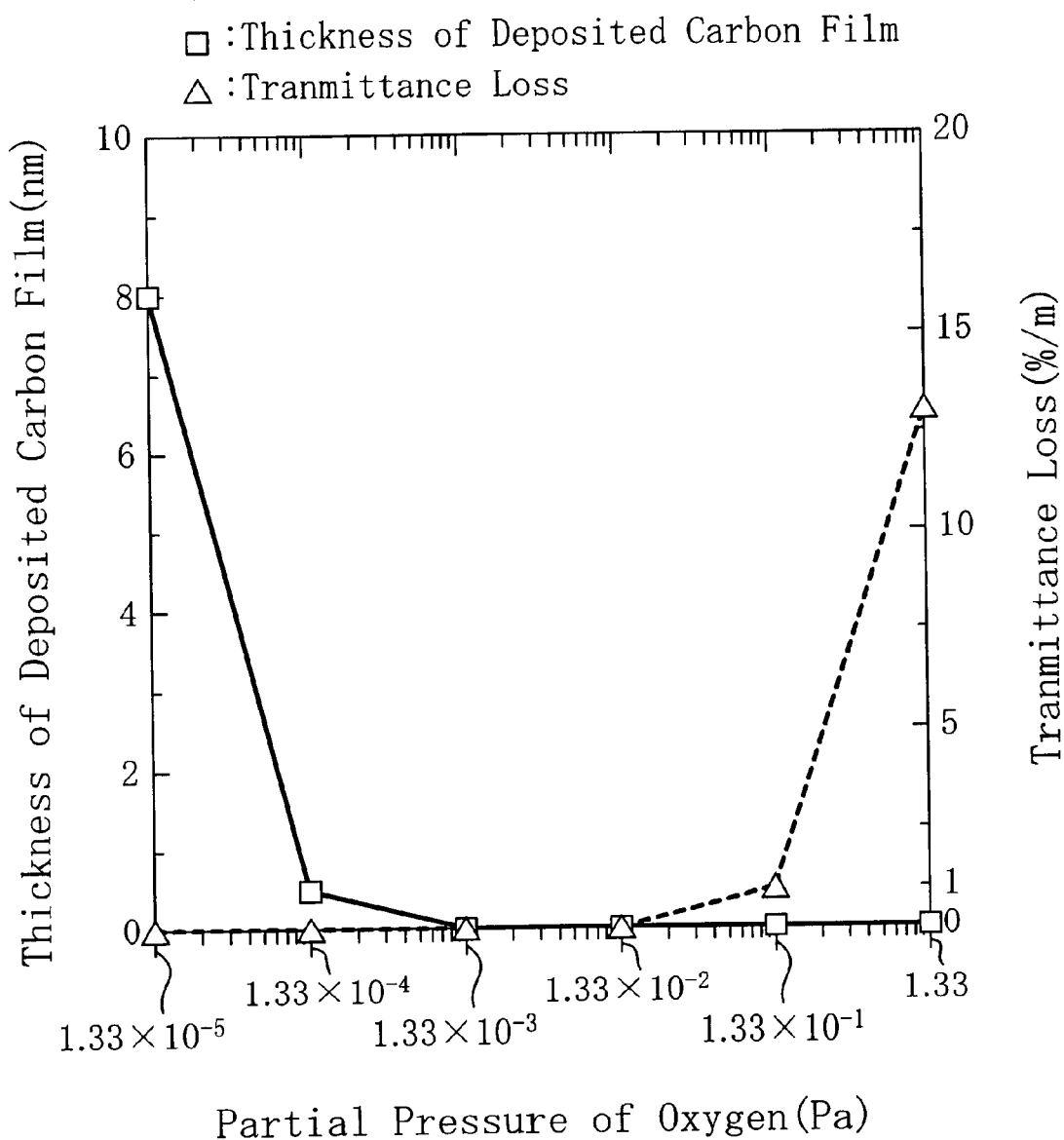
FIG. 5 is a diagram for showing the relationship, obtained by introducing a soft X-ray beam having been reflected by a reflecting mask to a reduction projection optical system in the soft X-ray reduction projection exposure system of Embodiment 3, between the partial pressure of an oxygen gas in the vicinity of the reduction projection optical system, the thickness of a carbon film adhered onto a reflecting face of the reduction projection optical system and the transmission loss per meter of the soft X-ray beam.

FIG. 5 shows the relationship between the partial pressure of the oxygen gas in the vicinity of the reduction projection optical system 324, the thickness of a carbon film adhered onto a reflecting face of the reduction projection optical system 324 and the transmittance loss per meter of the soft X-ray beam obtained by introducing the soft X-ray beam having been reflected by the reflecting mask 321 to the reduction projection optical system 324 continuously for 24 hours in the soft X-ray reduction projection exposure system of FIG. 4. In FIG. 5, points shown with □ indicate actually measured values of the thickness of the carbon film and a solid line is a virtual line obtained on the basis of these actually measured values. Also, points shown with Δ indicate actually measured values of the transmittance loss and a broken line is a virtual line obtained on the basis of these actually measured values.

As is obvious from FIG. 5, in the case where the partial pressure of the oxygen gas is lower than $1.33 \times 10^{-4}$ Pa, the thickness of the carbon film deposited on the surface of the reduction projection optical system 324 through the irradiation with the soft X-ray beam is abruptly increased. In contrast, in the case where the partial pressure of the oxygen gas exceeds $1.33 \times 10^{-4}$ Pa, the thickness of the deposited carbon film is approximately 0.1 nm.

On the surface of the reduction projection optical system 324, a reaction in which the absorbed carbon film is decomposed by oxygen atoms activated through the irradiation with the soft X-ray beam always occurs.

Accordingly, the thickness of the carbon film deposited on the surface of the reduction projection optical system 324 largely depends upon the partial pressure of the oxygen gas. In the case where the partial pressure of the oxygen gas is $1.33 \times 10^{-4}$ Pa or more, a degree of decomposing carbon is higher than a degree of carbon depositing on the surface of the reduction projection optical system 324, so that the thickness of the carbon film cannot increase.

Although the thickness of the carbon film is reduced as the partial pressure of the oxygen gas is higher, when the partial pressure of the oxygen gas is too high, a light absorbing function of the oxygen molecules becomes too large to neglect, and hence, the transmittance loss occurs. When the transmittance loss per meter of the soft X-ray beam exceeds 1%, the proportion of the soft X-ray beam generated by the discharge type X-ray source 311 to reach the surface of the wafer 331 is disadvantageously lowered.

As is understood from FIG. 5, in the case where the partial pressure of the oxygen gas is $1.33 \times 10^{-1}$ Pa, the transmittance loss is 1%. Therefore, it seems that the upper limit of the partial pressure of the oxygen gas is $1.33 \times 10^{-1}$ Pa.

For this reason, the partial pressure of the oxygen gas is controlled to be $1.33 \times 10^{-4}$ Pa through $1.33 \times 10^{-1}$ Pa in Embodiment 3. Therefore, the thickness of the carbon film deposited on the reflecting face of the reduction projection optical system 324 can be suppressed to approximately 0.1 nm without increasing the transmittance loss of the soft X-ray beam. Accordingly, the optical characteristic can be prevented from degrading due to the contamination of the reflecting face of the reduction projection optical system 324 with an organic substance.

In this embodiment, the relationship between the partial pressure of the oxygen gas within the region where the reduction projection optical system 324 is disposed in the second chamber 320 and the thickness of the carbon film deposited on the surface of the reduction projection optical system 324 is described. This relationship also holds between the partial pressure of the oxygen gas within a region where the illumination optical system 312 is disposed in the first chamber 310 and the thickness of a carbon film deposited on the surface of the illumination optical system 312 and between the partial pressure of the oxygen gas within the region where the reflecting mask 321 is disposed in the second chamber 320 and the thickness of a carbon film deposited on the surface of the reflecting mask 321. Specifically, when the partial pressure of the oxygen gas within the region where the illumination optical system 312 is disposed in the first chamber 310 and the partial pressure of the oxygen gas within the region where the reflecting mask 321 is disposed in the second chamber 320 are respectively controlled to be $1.33 \times 10^{-4}$ Pa through $1.33 \times 10^{-1}$ Pa, the thicknesses of the carbon films deposited on the reflecting faces of the illumination optical system 312 and the reflecting mask 321 can be suppressed to approximately 0.1 nm without increasing the transmittance loss of the soft X-ray beam.

Also, although the oxygen gas not ionized is introduced in Embodiment 3, an ionized oxygen gas may be introduced instead. However, the oxygen gas not ionized is preferably introduced because the surface of the reflecting mirror is minimally damaged.

Although the partial pressure of the oxygen gas is controlled to be $1.33 \times 10^{-4}$ Pa through $1.33 \times 10^{-1}$ Pa in all of the inside region of the first chamber 310 and the regions where the reflecting mask 321 and the reduction projection optical system 324 are disposed in the second chamber 320 in Embodiment 3, the partial pressure of the oxygen gas may be controlled to be $1.33 \times 10^{-4}$ Pa through $1.33 \times 10^{-1}$ Pa in at least one of these regions.

As a characteristic of Embodiment 3, the total pressure within the first chamber 310 and the total pressures within the regions where the reflecting mask 321 and the reduction projection optical system 324 are disposed in the second chamber 320 are controlled to be $1.33 \times 10^{-1}$ Pa or less.

Thus, any gas other than the oxygen gas, such as a gas of an inorganic substance like a metal element, can be suppressed. Therefore, the optical characteristics can be prevented from degrading due to the contamination, with an inorganic substance, of the reflecting faces of the illumination optical system 312, the reflecting mask 321 and the reduction projection optical system 324.

In Embodiment 3, the partial pressure of the oxygen gas within the first chamber 310 is controlled by the first diffusion pump 313, and the partial pressures of the oxygen gas within the regions where the reflecting mask 321 and the reduction projection optical system 324 are disposed in the second chamber 320 are controlled by the second diffusion pump 325. These diffusion pumps may be provided to the respective chambers or the respective regions, or a common diffusion pump may be provided to a plurality of chambers or a plurality of regions.

In particular, the partial pressure of the oxygen gas within the region of the reflecting mask 321 is disposed in the second chamber 320 and the partial pressure of the oxygen gas within the region where the reduction projection optical system 324 is disposed in the second chamber 320 are both controlled by the second diffusion pump 325 in Embodiment 3. However, the partial pressures of the oxygen gas within the region where the reflecting mask 321 is disposed and within the region where the reduction projection optical system 324 is disposed are preferably individually controlled by different diffusion pumps.

Although the discharge type X-ray source 311 is used as the soft X-ray source in Embodiment 3, another soft X-ray source such as a laser induced plasma X-ray source may be used instead.

Also, although the reflecting mirrors are used as the illumination optical system 312 and the reduction projection optical system 324 in Embodiment 3, another means may be employed instead.

Furthermore, although the diffusion pumps are used as pressure reducing means in Embodiment 3, another vacuum pumping device such as a turbo pump or an ion pump may be used instead.

Embodiment 4

A soft X-ray reduction projection exposure system and a soft X-ray reduction projection exposure method according to Embodiment 4 of the invention will now be described with reference to FIG. 6.

Figure 6:
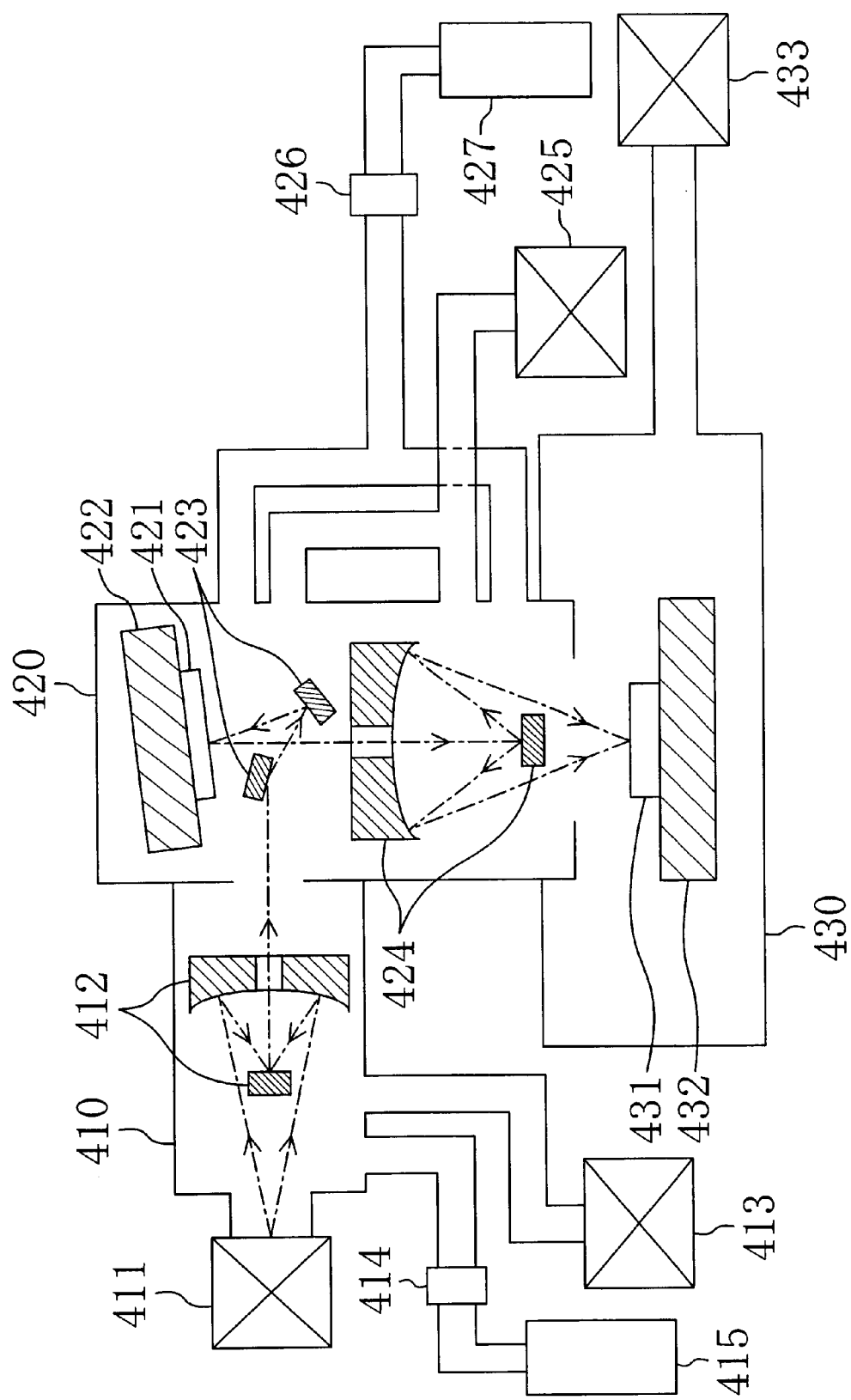
FIG. 6 is a rough cross-sectional view of a soft X-ray reduction projection exposure system according to Embodiment 4 of the invention.

FIG. 6 is a rough cross-sectional view of the soft X-ray reduction projection exposure system of Embodiment 4, which includes a first chamber 410, a second chamber 420 and a third chamber 430 communicating with one another.

The first chamber 410 includes a discharge type X-ray source 411 for generating a soft X-ray beam, an illumination optical system 412 for transmitting the soft X-ray beam generated by the discharge type X-ray source 411 to the second chamber 420, a first diffusion pump 413 for reducing the pressure within the first chamber 410, and a first ozone cylinder 415 serving as first ozone gas supply means for supplying an ozone gas to the first chamber 410 through a first massflow controller 414 for controlling the flow rate of the ozone gas.

The second chamber 420 includes a reflecting mask 421 on which a desired pattern is formed, a mask stage 422 for holding the reflecting mask 421, a reflecting optical system 423 for introducing the soft X-ray beam having been transmitted from the illumination optical system 412 of the first chamber 410 to the reflecting mask 421, a reduction projection optical system 424 for reducing the soft X-ray beam having been reflected by the reflecting mask 421 and transmitting the reduced soft X-ray beam to the third chamber 430, a second diffusion pump 425 for reducing the pressure within the second chamber 420, and a second ozone cylinder 427 serving as second ozone gas supply means for supplying an ozone gas to the second chamber 420 through a second massflow controller 426 for controlling the flow rate of the ozone gas.

The third chamber 430 includes a wafer 431 on which a pattern is to be formed, a wafer stage 432 for holding the wafer 431, and a third diffusion pump 433 for reducing the pressure within the third chamber 430. The soft X-ray beam transmitted from the reduction projection optical system 424 of the second chamber 420 to the third chamber 430 irradiate the surface of the wafer 431.

As a characteristic of Embodiment 4, the partial pressure of the ozone gas within the first chamber 410 is controlled to be $1.33 \times 10^{-4}$ Pa through $4.00 \times 10^{-2}$ Pa by the first diffusion pump 413 and the first massflow controller 414, and the partial pressures of the ozone gas within regions where the reflecting mask 421 and the reduction projection optical system 424 are disposed in the second chamber 420 are controlled to be $1.33 \times 10^{-4}$ Pa through $4.00 \times 10^{-2}$ Pa by the second diffusion pump 425 and the second massflow controller 426.

Figure 7:
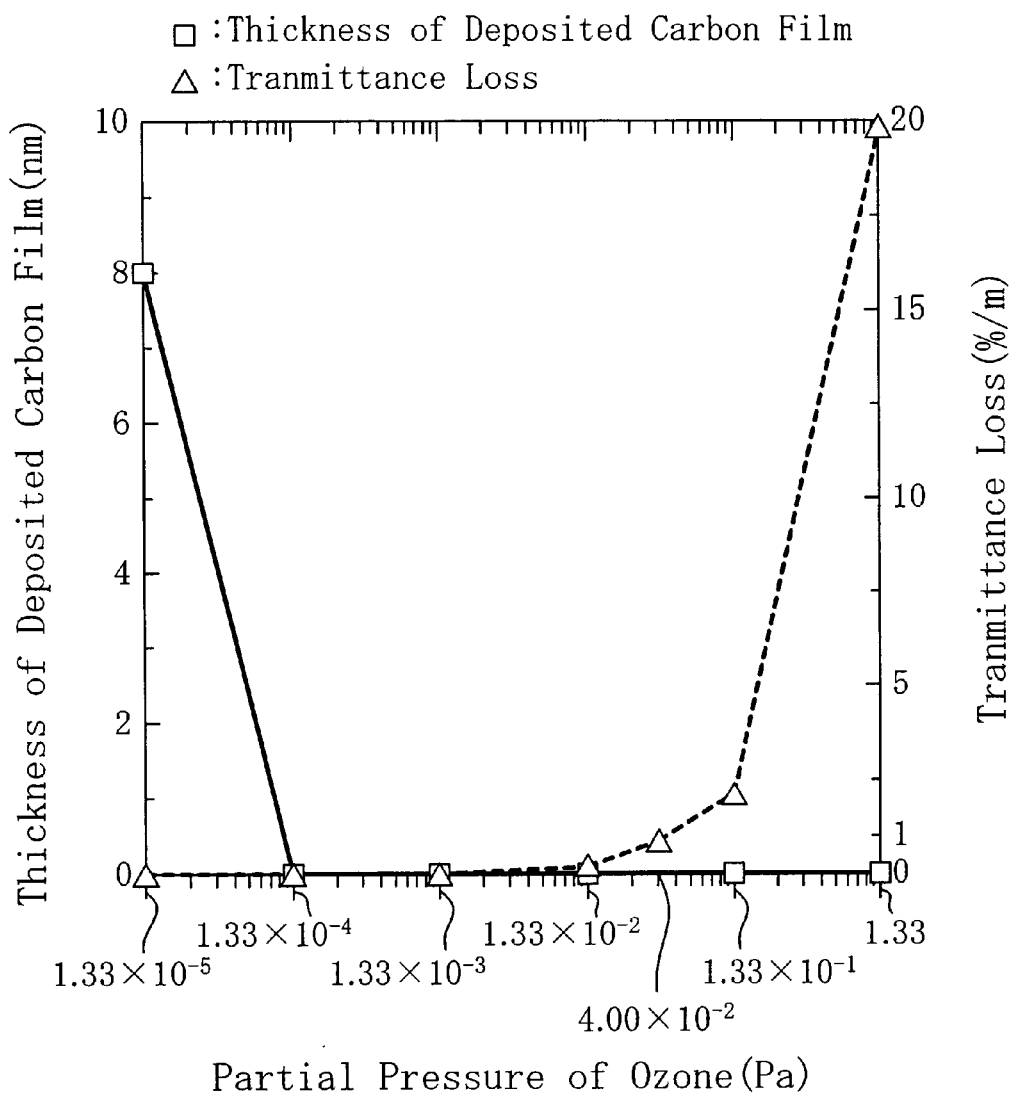
FIG. 7 is a diagram for showing the relationship, obtained by introducing a soft X-ray beam having been reflected by a reflecting mask to a reduction projection optical system in the soft X-ray reduction projection exposure system of Embodiment 4, between the partial pressure of an ozone gas in the vicinity of the reduction projection optical system, the thickness of a carbon film adhered onto a reflecting face of the reduction projection optical system and the transmittance loss per meter of the soft X-ray beam.

FIG. 7 shows the relationship between the partial pressure of the ozone gas in the vicinity of the reduction projection optical system 424, the thickness of a carbon film adhered onto a reflecting face of the reduction projection optical system 424 and the transmittance loss per meter of the soft X-ray beam obtained by introducing the soft X-ray beam having been reflected by the reflecting mask 421 to the reduction projection optical system 424 continuously for 24 hours in the soft X-ray reduction projection exposure system of FIG. 5. In FIG. 7, points shown with □ indicate actually measured values of the thickness of the carbon film and a solid line is a virtual line obtained on the basis of these actually measured values. Also, points shown with Δ indicate actually measured values of the transmittance loss and a broken line is a virtual line obtained on the basis of these actually measured values.

As is obvious from FIG. 7, in the case where the partial pressure of the ozone gas is lower than $1.33 \times 10^{-4}$ Pa, the thickness of the carbon film deposited on the surface of the reduction projection optical system 424 through the irradiation with the soft X-ray beam is abruptly increased. In contrast, in the case where the partial pressure of the ozone gas exceeds $1.33 \times 10^{-4}$ Pa, the carbon film is minimally deposited.

On the surface of the reduction projection optical system 424, an oxidation/decomposition reaction caused by ozone molecules always occurs.

Accordingly, the thickness of the carbon film deposited on the surface of the reduction projection optical system 424 largely depends upon the partial pressure of the ozone gas. In the case where the partial pressure of the ozone gas is $1.33 \times 10^{-4}$ Pa or more, a degree of decomposing carbon is higher than a degree of carbon depositing on the surface of the reduction projection optical system 424, so that the thickness of the carbon film cannot increase.

Although the thickness of the carbon film is reduced as the partial pressure of the ozone gas is higher, when the partial pressure of the ozone gas is too high, a light absorbing function of the ozone molecules becomes too large to neglect, and hence, the transmittance loss occurs. When the transmittance loss per meter of the soft X-ray beam exceeds 1%, the proportion of the soft X-ray beam generated by the discharge type X-ray source 411 to reach the surface of the wafer 431 is disadvantageously lowered.

As is understood from FIG. 7, in the case where the partial pressure of the ozone gas is $4.00 \times 10^{-2}$ Pa, the transmittance loss is 1%. Therefore, it seems that the upper limit of the partial pressure of the ozone gas is $4.00 \times 10^{-2}$ Pa.

For this reason, the partial pressure of the ozone gas is controlled to be $1.33 \times 10^{-4}$ Pa through $4.00 \times 10^{-2}$ Pa in Embodiment 4. Therefore, the carbon film is minimally deposited on the reflecting face of the reduction projection optical system 424 without increasing the transmittance loss of the soft X-ray beam. Accordingly, the optical characteristic can be prevented from degrading due to the contamination of the reflecting face of the reduction projection optical system 424 with an organic substance.

In this embodiment, the relationship between the partial pressure of the ozone gas within the region where the reduction projection optical system 424 is disposed in the second chamber 420 and the thickness of the carbon film deposited on the surface of the reduction projection optical system 424 is described. This relationship also holds between the partial pressure of the ozone gas within a region where the illumination optical system 412 is disposed in the first chamber 410 and the thickness of a carbon film deposited on the surface of the illumination optical system 412 and between the partial pressure of the ozone gas within the region where the reflecting mask 421 is disposed in the second chamber 420 and the thickness of a carbon film deposited on the surface of the reflecting mask 421. Specifically, when the partial pressure of the ozone gas within the region where the illumination optical system 412 is disposed in the first chamber 410 and the partial pressure of the ozone gas within the region where the reflecting mask 421 is disposed in the second chamber 420 are respectively controlled to be $1.33 \times 10^{-4}$ Pa through $4.00 \times 10^{-2}$ Pa, the carbon films can be substantially prevented from depositing on the reflecting faces of the illumination optical system 412 and the reflecting mask 421 without increasing the transmittance loss of the soft X-ray beam.

Although the partial pressure of the ozone gas is controlled to be $1.33 \times 10^{-4}$ Pa through $4.00 \times 10^{-2}$ Pa in all of the inside region of the first chamber 410 and the regions where the reflecting mask 421 and the reduction projection optical system 424 are disposed in the second chamber 420 in Embodiment 4, the partial pressure of the ozone gas may be controlled to be $1.33 \times 10^{-4}$ Pa through $4.00 \times 10^{-2}$ Pa in at least one of these regions.

As a characteristic of Embodiment 4, the total pressure within the first chamber 410 and the total pressures within the regions where the reflecting mask 421 and the reduction projection optical system 424 are disposed in the second chamber 420 are controlled to be $4.00 \times 10^{-2}$ Pa or less.

Thus, any gas other than the ozone gas, such as a gas of an inorganic substance like a metal element, can be suppressed. Therefore, the optical characteristics can be prevented from degrading due to the contamination, with an inorganic substance, of the reflecting faces of the illumination optical system 412, the reflecting mask 421 and the reduction projection optical system 424.

In Embodiment 4, the partial pressure of the ozone gas within the first chamber 410 is controlled by the first diffusion pump 413, and the partial pressures of the ozone gas within the regions where the reflecting mask 421 and the reduction projection optical system 424 are disposed in the second chamber 420 are controlled by the second diffusion pump 425. These diffusion pumps may be provided to the respective chambers or the respective regions, or a common diffusion pump may be provided to a plurality of chambers or a plurality of regions.

In particular, the partial pressure of the ozone gas within the region of the reflecting mask 421 is disposed in the second chamber 420 and the partial pressure of the ozone gas within the region where the reduction projection optical system 424 is disposed in the second chamber 420 are both controlled by the second diffusion pump 425 in Embodiment 4. However, the partial pressures of the oxygen gas within the region where the reflecting mask 421 is disposed and within the region where the reduction projection optical system 424 is disposed are preferably individually controlled by different diffusion pumps.

Although the discharge type X-ray source 411 is used as the soft X-ray source in Embodiment 4, another soft X-ray source such as a laser induced plasma X-ray source may be used instead.

Also, although the reflecting mirrors are used as the illumination optical system 412 and the reduction projection optical system 424 in Embodiment 4, another means may be employed instead.

Furthermore, although the diffusion pumps are used as pressure reducing means in Embodiment 4, another vacuum pumping device such as a turbo pump or an ion pump may be used instead.

Embodiment 5

In Embodiment 5, a pattern formation method performed by using the soft X-ray reduction projection exposure system according to any of Embodiments 1 through 4 will be described. Although the soft X-ray reduction projection exposure system of Embodiment 1 is used in the following description, it goes without saying that the pattern formation method can be similarly performed by using the soft X-ray reduction projection exposure system of Embodiment 2, 3 or 4.

First, after forming a multi-layer film composed of a molybdenum film and a silicon film on a glass substrate, an absorbing film of chromium is selectively formed on a portion of the multi-layer film where a desired pattern is to be formed. Thus, the reflecting mask 121 is prepared and then held on the mask stage 122.

Next, a resist film with a thickness of 200 nm is formed by applying a resist material photosensitive with a soft X-ray beam onto the wafer 131 by spin coating, and the resist film is cured through annealing at a temperature of 110° C. for 60 seconds. Thereafter, the wafer 131 having the resist film is held on the wafer stage 132.

Then, a soft X-ray beam is generated by the radiating X-ray source 111 within the first chamber 110 in which the partial pressure of a carbon compound gas is controlled to be $1.33 \times 10^{-8}$ Pa or less. The generated soft X-ray beam are transmitted by the illumination optical system 112 to the second chamber 120 in which the partial pressure of the carbon compound gas is controlled to be $1.33 \times 10^{-8}$ Pa or less. In the second chamber 120, the soft X-ray beam having been transmitted from the first chamber 110 is introduced to the reflecting mask 121 by the reflecting optical system 123, and the soft X-ray beam having been reflected by the reflecting mask 121 is transmitted by the reduction projection optical system 124 to the third chamber 130 in which the partial pressure of the carbon compound gas is controlled to be $1.33 \times 10^{-8}$ Pa or less, so that the resist film formed on the wafer 131 disposed in the third chamber 130 can be irradiated with the soft X-ray beam for pattern exposure.

Thereafter, the wafer 131 is taken out from the soft X-ray reduction projection exposure system, and the resist film is subjected to post-bake at a temperature of 110° C. for 60 seconds. Then, the resist film is developed with an alkaline developer, resulting in obtaining a resist pattern.

In this manner, a resist pattern with a pattern width of 50 nm free from pattern distortion derived from aberration can be precisely formed.

Even after this pattern formation method is continuously performed for a half year or 1 year, no pattern distortion derived from aberration is caused and the resolution is not changed from that attained at the beginning.

Accordingly, since the pattern exposure is performed with the inside pressures of the first chamber 110 and the second chamber 120 controlled to be $1.33\times10^{-8}$ Pa or less in the pattern formation method of Embodiment 5, the illumination optical system 112, the reflecting mask 121 and the reduction projection optical system 124 are not contaminated with an organic substance. As a result, a precise resist pattern with no distortion derived from aberration can be stably formed for a long period of time.

Although the glass substrate, the multi-layer film composed of a molybdenum film and a silicon film and the chromium film are used as the materials for the reflecting mask 121, the structure of the reflecting mask is not limited to this.

Also, the conditions for forming a resist film are not limited to those described above.

What is claimed is:

1. A soft X-ray reduction projection exposure system comprising:
   a light source for generating a soft X-ray beam of a wavelength of a 4 through 20 nm band;
   a reflecting mask on which a desired pattern is formed;
   an illumination optical system for irradiating said reflecting mask with said soft X-ray beam;
   a reduction projection optical system for imaging said pattern of said reflecting mask on a wafer; and
   controlling means for controlling a partial pressure of a gas of a carbon compound to be $1.33\times10^{-8}$ Pa or less in at least one of a first region where said illumination optical system is disposed, a second region where said reflecting mask is disposed and a third region where said reduction projection optical system is disposed.

2. The soft X-ray reduction projection exposure system of claim 1,
   wherein said controlling means reduces a pressure in at least one of said first region, said second region and said third region individually.

3. The soft X-ray reduction projection exposure system of claim 1,
   wherein said controlling means controls a total pressure to be $1.33\times10^{-4}$ Pa or less in any region where said partial pressure of the gas of said carbon compound is controlled to be $1.33\times10^{-8}$ Pa or less among said first region, said second region and said third region.

4. The soft X-ray reduction projection exposure system of claim 1,
   wherein said carbon compound is any of a hydrocarbon such as methane, ethane or propane, a straight-chain organic substance such as isopropyl alcohol or polymethyl methacrylate and a cyclic organic substance such as benzene or phthalate.

5. A soft X-ray reduction projection exposure system comprising:
   a light source for generating a soft X-ray beam of a wavelength of a 4 through 20 nm band;
   a reflecting mask on which a desired pattern is formed;
   an illumination optical system for irradiating said reflecting mask with said soft X-ray beam;
   a reduction projection optical system for imaging said pattern of said reflecting mask on a wafer; and
   capturing means for capturing a carbon compound generated in at least one of a first region where said illumination optical system is disposed, a second region where said reflecting mask is disposed and a third region where said reduction projection optical system is disposed.

6. The soft X-ray reduction projection exposure system of claim 5,
   wherein said capturing means is a filter cooled with liquid helium or liquid nitrogen.

7. The soft X-ray reduction projection exposure system of claim 5,
   wherein said capturing means captures said carbon compound in at least one of said first region, said second region and said third region individually.

8. The soft X-ray reduction projection exposure system of claim 5,
   wherein said carbon compound is any of a hydrocarbon such as methane, ethane or propane, a straight-chain organic substance such as isopropyl alcohol or polymethyl methacrylate and a cyclic organic substance such as benzene or phthalate.

9. A soft X-ray reduction projection exposure system comprising:
   a light source for generating a soft X-ray beam of a wavelength of a 4 through 20 nm band;
   a reflecting mask on which a desired pattern is formed;
   an illumination optical system for irradiating said reflecting mask with said soft X-ray beam;
   a reduction projection optical system for imaging said pattern of said reflecting mask on a wafer; and
   controlling means for controlling a partial pressure of an oxygen gas to be $1.33\times10^{-4}$ Pa through $1.33\times10^{-1}$ Pa in at least one of a first region where said illumination optical system is disposed, a second region where said reflecting mask is disposed and a third region where said reduction projection optical system is disposed.

10. The soft X-ray reduction projection exposure system of claim 9,
    wherein said controlling means controls a total pressure to be $1.33\times10^{-1}$ Pa or less in any region where said partial pressure of said oxygen gas is controlled to be $1.33\times10^{-4}$ Pa through $1.33\times10^{-1}$ Pa among said first region, said second region and said third region.

11. A soft X-ray reduction projection exposure system comprising:
    a light source for generating a soft X-ray beam of a wavelength of a 4 through 20 nm band;
    a reflecting mask on which a desired pattern is formed;
    an illumination optical system for irradiating said reflecting mask with said soft X-ray beam;
    a reduction projection optical system for imaging said pattern of said reflecting mask on a wafer; and
    controlling means for controlling a partial pressure of an ozone gas to be $1.33\times10^{-4}$ Pa through $4.00\times10^{-2}$ Pa in at least one of a first region where said illumination optical system is disposed, a second region where said reflecting mask is disposed and a third region where said reduction projection optical system is disposed.

12. The soft X-ray reduction projection exposure system of claim 11,
    wherein said controlling means controls a total pressure to be $4.00\times10^{-2}$ Pa or less in any region where said partial pressure of said ozone gas is controlled to be $1.33\times10^{-4}$ Pa through $4.00\times10^{-2}$ Pa among said first region, said second region and said third region.

13. A soft X-ray reduction projection exposure method comprising:
   a step of introducing, by an illumination optical system, a soft X-ray beam of a wavelength of a 4 through 20 nm band to a reflecting mask on which a desired pattern is formed;
   a step of imaging, by a reduction projection optical system, said pattern of said reflecting mask on a wafer; and
   a controlling step of controlling a partial pressure of a gas of a carbon compound to be $1.33 \times 10^{-8}$ Pa or less in at least one of a first region where said illumination optical system is disposed, a second region where said reflecting mask is disposed and a third region where said reduction projection optical system is disposed.

14. The soft X-ray reduction projection exposure method of claim 13,
   wherein the controlling step includes a sub-step of reducing a pressure in at least one of said first region, said second region and said third region individually.

15. The soft X-ray reduction projection exposure method of claim 13,
   wherein the controlling step includes a sub-step of controlling a total pressure to be $1.33 \times 10^{-4}$ Pa or less in any region where said partial pressure of the gas of said carbon compound is controlled to be $1.33 \times 10^{-8}$ Pa or less among said first region, said second region and said third region.

16. The soft X-ray reduction projection exposure method of claim 13,
   wherein said carbon compound is any of a hydrocarbon such as methane, ethane or propane, a straight-chain organic substance such as isopropyl alcohol or polymethyl methacrylate, and a cyclic organic substance such as benzene or phthalate.

17. A soft X-ray reduction projection exposure method comprising:
   a step of introducing, by an illumination optical system, a soft X-ray beam of a wavelength of a 4 through 20 nm band to a reflecting mask on which a desired pattern is formed;
   a step of imaging, by a reduction projection optical system, said pattern of said reflecting mask on a wafer; and
   a capturing step of capturing a carbon compound generated in at least one of a first region where said illumination optical system is disposed, a second region where said reflecting mask is disposed and a third region where said reduction projection optical system is disposed.

18. The soft X-ray reduction projection exposure method of claim 17,
   wherein the capturing step includes a sub-step of capturing said carbon compound by using a filter cooled with liquid helium or liquid nitrogen.

19. The soft X-ray reduction projection exposure method of claim 17,
   wherein the capturing step includes a sub-step of capturing said carbon compound in at least one of said first region, said second region and said third region individually.

20. The soft X-ray reduction projection exposure method of claim 17,
   wherein said carbon compound is any of a hydrocarbon such as methane, ethane or propane, a straight-chain organic substance such as isopropyl alcohol or polymethyl methacrylate, and a cyclic organic substance such as benzene or phthalate.

21. A soft X-ray reduction projection exposure method comprising:
   a step of introducing, by an illumination optical system, a soft X-ray beam of a wavelength of a 4 through 20 nm band to a reflecting mask on which a desired pattern is formed;
   a step of imaging, by a reduction projection optical system, said pattern of said reflecting mask on a wafer; and
   a controlling step of controlling a partial pressure of an oxygen gas to be $1.33 \times 10^{-4}$ Pa through $1.33 \times 10^{-1}$ Pa in at least one of a first region where said illumination optical system is disposed, a second region where said reflecting mask is disposed and a third region where said reduction projection optical system is disposed.

22. The soft X-ray reduction projection exposure method of claim 21,
   wherein the controlling step includes a sub-step of controlling a total pressure to be $1.33 \times 10^{-1}$ Pa or less in any region where said partial pressure of said oxygen gas is controlled to be $1.33 \times 10^{-4}$ Pa through $1.33 \times 10^{-1}$ Pa among said first region, said second region and said third region.

23. A soft X-ray reduction projection exposure method comprising:
   a step of introducing, by an illumination optical system, a soft X-ray beam of a wavelength of a 4 through 20 nm band to a reflecting mask on which a desired pattern is formed;
   a step of imaging, by a reduction projection optical system, said pattern of said reflecting mask on a wafer; and
   a controlling step of controlling a partial pressure of an ozone gas to be $1.33 \times 10^{-4}$ Pa through $4.00 \times 10^{-2}$ Pa in at least one of a first region where said illumination optical system is disposed, a second region where said reflecting mask is disposed and a third region where said reduction projection optical system is disposed.

24. The soft X-ray reduction projection exposure method of claim 23,
   wherein the controlling step includes a sub-step of controlling a total pressure to be $4.00 \times 10^{-2}$ Pa or less in any region where said partial pressure of said oxygen gas is controlled to be $1.33 \times 10^{-4}$ Pa through $4.00 \times 10^{-2}$ Pa among said first region, said second region and said third region.

25. A pattern formation method comprising:
   a step of introducing, by an illumination optical system, a soft X-ray beam of a wavelength of a 4 through 20 nm band to a reflecting mask on which a desired pattern is formed;
   a step of imaging, by a reduction projection optical system, said pattern of said reflecting mask on a resist film;
   a step of forming a resist pattern by developing said resist film on which said pattern of said reflecting mask has been imaged; and
   a controlling step of controlling a partial pressure of a gas of a carbon compound to be $1.33 \times 10^{-8}$ Pa or less in at least one of a first region where said illumination optical system is disposed, a second region where said reflecting mask is disposed and a third region where said reduction projection optical system is disposed.

26. The pattern formation method of claim 25,
wherein the controlling step includes a sub-step of reducing a pressure in at least one of said first region, said second region and said third region individually.

27. The pattern formation method of claim 25,
wherein the controlling step includes a sub-step of controlling a total pressure to be $1.33 \times 10^{-4}$ Pa or less in any region where said partial pressure of the gas of said carbon compound is controlled to be $1.33 \times 10^{-8}$ Pa or less among said first region, said second region and said third region.

28. The pattern formation method of claim 25,
wherein said carbon compound is any of a hydrocarbon such as methane, ethane or propane, a straight-chain organic substance such as isopropyl alcohol or polymethyl methacrylate, and a cyclic organic substance such as benzene or phthalate.

29. A pattern formation method comprising:

a step of introducing, by an illumination optical system, a soft X-ray beam of a wavelength of a 4 through 20 nm band to a reflecting mask on which a desired pattern is formed;

a step of imaging, by a reduction projection optical system, said pattern of said reflecting mask on a resist film;

a step of forming a resist pattern by developing said resist film on which said pattern of said reflecting mask has been imaged; and a capturing step of capturing a carbon compound generated in at least one of a first region where said illumination optical system is disposed, a second region where said reflecting mask is disposed and a third region where said reduction projection optical system is disposed.

30. The pattern formation method of claim 29,
wherein the capturing step includes a sub-step of capturing said carbon compound by using a filter cooled with liquid helium or liquid nitrogen.

31. The pattern formation method of claim 29,
wherein the capturing step includes a sub-step of capturing said carbon compound in at least one of said first region, said second region and said third region individually.

32. The pattern formation method of claim 29,
wherein said carbon compound is any of a hydrocarbon such as methane, ethane or propane, a straight-chain organic substance such as isopropyl alcohol or polymethyl methacrylate, and a cyclic organic substance such as benzene or phthalate.

33. A pattern formation method comprising:

a step of introducing, by an illumination optical system, a soft X-ray beam of a wavelength of a 4 through 20 nm band to a reflecting mask on which a desired pattern is formed;

a step of imaging, by a reduction projection optical system, said pattern of said reflecting mask on a resist film;

a step of forming a resist pattern by developing said resist film on which said pattern of said reflecting mask has been imaged; and a controlling step of controlling a partial pressure of an oxygen gas to be $1.33 \times 10^{-4}$ Pa through $1.33 \times 10^{-1}$ Pa in at least one of a first region where said illumination optical system is disposed, a second region where said reflecting mask is disposed and a third region where said reduction projection optical system is disposed.

34. The pattern formation method of claim 33,
wherein the controlling step includes a sub-step of controlling a total pressure to be $1.33 \times 10^{-1}$ Pa or less in any region where said partial pressure of said oxygen gas is controlled to be $1.33 \times 10^{-4}$ Pa through $1.33 \times 10^{-1}$ Pa among said first region, said second region and said third region.

35. A pattern formation method comprising:

a step of introducing, by an illumination optical system, a soft X-ray beam of a wavelength of a 4 through 20 nm band to a reflecting mask on which a desired pattern is formed;

a step of imaging, by a reduction projection optical system, said pattern of said reflecting mask on a resist film;

a step of forming a resist pattern by developing said resist film on which said pattern of said reflecting mask has been imaged; and a controlling step of controlling a partial pressure of an ozone gas to be $1.33 \times 10^{-4}$ Pa through $4.00 \times 10^{-2}$ Pa in at least one of a first region where said illumination optical system is disposed, a second region where said reflecting mask is disposed and a third region where said reduction projection optical system is disposed.

36. The pattern formation method of claim 35,
wherein the controlling step includes a sub-step of controlling a total pressure to be $4.00 \times 10^{-2}$ Pa or less in any region where said partial pressure of said oxygen gas is controlled to be $1.33 \times 10^{-4}$ Pa through $4.00 \times 10^{-2}$ Pa among said first region, said second region and said third region.

\* \* \* \* \*